US012660537B2

(12) United States Patent
Ling et al.

(10) Patent No.: US 12,660,537 B2
(45) Date of Patent: Jun. 16, 2026

(54) ETCHING METHODS FOR REDUCING MICRO AND MACRO SCALLOPING ON SIDEWALLS OF ETCHED FEATURES OF SEMICONDUCTOR DEVICES

(71) Applicant: Applied Materials, Inc., Santa Clara, CA (US)

(72) Inventors: Mang-Mang Ling, San Jose, CA (US); Jong Mun Kim, San Jose, CA (US); Srinivas D. Nemani, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 624 days.

(21) Appl. No.: 18/158,916

(22) Filed: Jan. 24, 2023

(65) Prior Publication Data

US 2024/0249936 A1     Jul. 25, 2024

(51) Int. Cl.
    *H10P 50/26*          (2026.01)
    *H10P 14/60*          (2026.01)
    (Continued)

(52) U.S. Cl.
    CPC ........ *H10P 50/266* (2026.01); *H10P 14/6304* (2026.01); *H10P 14/6309* (2026.01);
    (Continued)

(58) Field of Classification Search
    CPC ........... H01L 21/0223; H01L 21/02238; H01L 21/02244; H01L 21/0332; H01L 21/0337;
    (Continued)

(56) References Cited

U.S. PATENT DOCUMENTS 9,633,846 B2 * 4/2017 Paterson ........... H01L 21/32137
10,123,427 B2 11/2018 Zwiers et al.
(Continued)

FOREIGN PATENT DOCUMENTS

CN        103811416 A * 5/2014 ....... H01L 21/76819
CN        104979369 A   10/2015
(Continued)

OTHER PUBLICATIONS

F. Rahman and J. C. Runyon, "Atomic Layer Processes for Material Growth and Etching—A Review," in IEEE Transactions on Semiconductor Manufacturing, vol. 34, No. 4, pp. 500-512, Nov. 2021, doi: 10.1109/TSM.2021.3112502. (Year: 2021).*
(Continued)

*Primary Examiner* — Eliseo Ramos Feliciano
*Assistant Examiner* — Brad A Knudson
(74) *Attorney, Agent, or Firm* — Patterson + Sheridan, LLP

(57)          ABSTRACT

Embodiments of the present disclosure relate to methods for patterning a material layer on a substrate. The method includes forming a hard mask layer on a material layer disposed on a substrate. The material layer includes a plurality of first layers and a plurality of second layers alternately formed over the substrate. The method further includes performing a first etch process to form features in the material layer through the hard mask layer by supplying a first etching gas; performing an oxidation process to oxidize a sidewall of the features by supplying an oxidation gas; and performing a second etch process to etch the sidewall of the features formed in the material layer by suppling a second etching gas.

20 Claims, 6 Drawing Sheets

(51) Int. Cl.
  *H10P 50/00* (2026.01)
  *H10P 50/28* (2026.01)
  *H10P 76/40* (2026.01)
(52) U.S. Cl.
  CPC ........ *H10P 14/6314* (2026.01); *H10P 50/268* (2026.01); *H10P 50/283* (2026.01); *H10P 50/71* (2026.01); *H10P 76/405* (2026.01); *H10P 76/4085* (2026.01)
(58) Field of Classification Search
  CPC ......... H01L 21/31116; H01L 21/32137; H01L 21/32139; H01L 21/76802; H01L 21/76816; H01L 21/32136; H01L 21/3213; H10P 50/266; H10P 14/6304; H10P 14/6309; H10P 14/6314; H10P 50/268; H10P 50/283; H10P 50/71; H10P 76/405; H10P 76/4085
  See application file for complete search history.

(56) References Cited

U.S. PATENT DOCUMENTS

| | | | | |
|---|---|---|---|---|
| 2008/0057729 | A1* | 3/2008 | Shen | H01L 21/32137 438/735 |
| 2012/0129354 | A1 | 5/2012 | Luong | |
| 2014/0295636 | A1* | 10/2014 | Makala | H10D 30/693 438/287 |
| 2017/0110473 | A1 | 4/2017 | Lee | |
| 2017/0365487 | A1* | 12/2017 | Shen | C23C 16/56 |
| 2018/0223429 | A1* | 8/2018 | Fukazawa | C23C 16/45565 |
| 2019/0019681 | A1* | 1/2019 | Wong | H10D 30/024 |
| 2020/0251345 | A1 | 8/2020 | Yin et al. | |
| 2024/0194487 | A1* | 6/2024 | Zhao | H10D 84/0126 |

FOREIGN PATENT DOCUMENTS

| | | |
|---|---|---|
| JP | 6300258 B2 | 3/2018 |
| KR | 2007-0089058 A | 8/2007 |
| KR | 2020-0037402 A | 4/2020 |

OTHER PUBLICATIONS

PCT/US2023/078747, International Search Report and Written Opinion dated Mar. 18, 2024, 10 pages.

Zhao, Yu et al. "Formation mechanism of rounded SiGe-etch Front in isotropic SiGe plasma etching for gate-all-around FETs." IEEE Journal of the Electron Devices Society, Nov. 26, 2021, vol. 9, pp. 1112-1116.

Korean Office Action for Application No. 10-2025-7027748 dated Feb. 14, 2026.

F. Rahman et al., 'Atomic Layer Processes for Material Growth and Etching—A Review', IEEE Trans. on Semiconductor Manufacturing, vol. 34, No. 4, pp. 500-511, Nov. 2021.

* cited by examiner

100

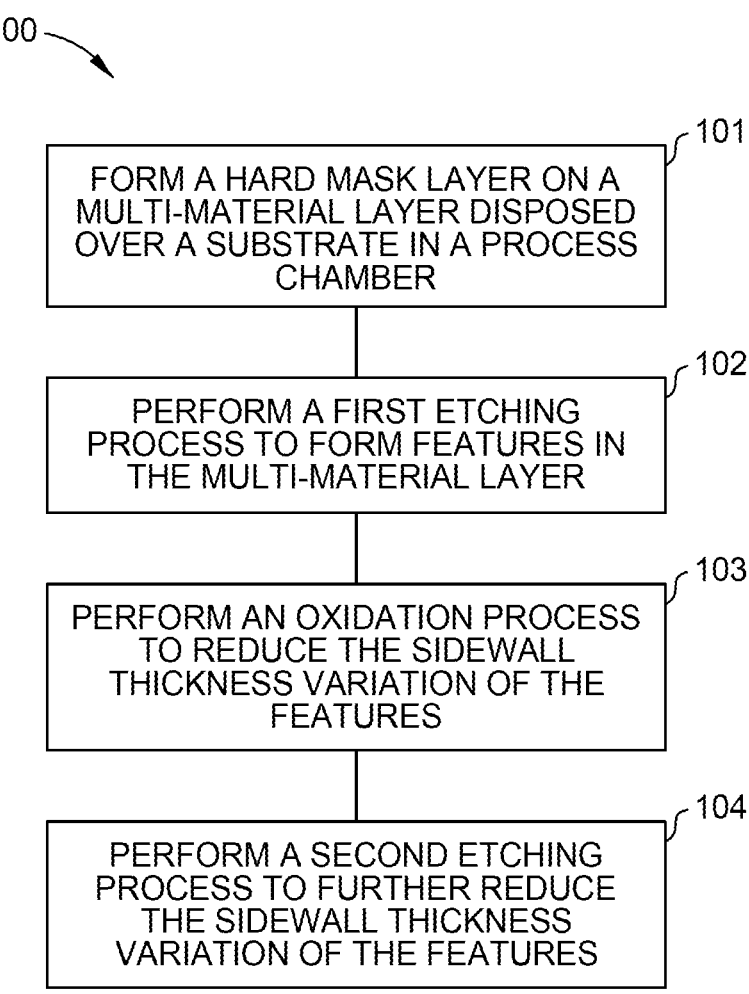

101
FORM A HARD MASK LAYER ON A MULTI-MATERIAL LAYER DISPOSED OVER A SUBSTRATE IN A PROCESS CHAMBER

102
PERFORM A FIRST ETCHING PROCESS TO FORM FEATURES IN THE MULTI-MATERIAL LAYER

103
PERFORM AN OXIDATION PROCESS TO REDUCE THE SIDEWALL THICKNESS VARIATION OF THE FEATURES

104
PERFORM A SECOND ETCHING PROCESS TO FURTHER REDUCE THE SIDEWALL THICKNESS VARIATION OF THE FEATURES

FIG. 1

ETCHING METHODS FOR REDUCING MICRO AND MACRO SCALLOPING ON SIDEWALLS OF ETCHED FEATURES OF SEMICONDUCTOR DEVICES

BACKGROUND

Field

Embodiments of the present disclosure generally relate to etching processes of structures in semiconductor applications. Particularly, embodiments of the present disclosure provide methods for etching multi-material layers to form features therein having sidewalls with reduced sidewall thickness variation.

Description of the Related Art

In smaller and lighter electronic devices with higher performance and increased features, three-dimensional (3D) integrated circuits (ICs) designed with through-vias and trenches have been adopted. Through-vias and trenches are used for electrical connections, which pass through multi-material layers formed on a semiconductor substrate. The adoption of through-vias and trenches has faced high costs and challenges associated with high volume manufacturing. One such challenge includes creating through-vias and trenches with sidewalls having reduced sidewall thickness variation. Through-vias and trenches with reduced sidewall thickness variation are generally more robust and can be effectively filled with materials such as dielectrics and metals. In contrast, through-vias and trenches with large sidewall thickness variation (e.g., scalloped sidewalls) can result in ineffective filling, leading to reduced yield and long-term device reliability problems. Unfortunately, existing etching methods create through-vias and trenches with large sidewall thickness variation, and/or are impractical for high volume manufacturing. Another factor influencing adoption of through-vias and trenches includes the cost of performing plasma etching, which is influenced by, for example, the overall etch rate.

Therefore, there is a need for a method for performing an etching process for forming features having reduced sidewall thickness variation in multi-material layers with a fast etch rate.

SUMMARY

Embodiments of the present disclosure provide a method for patterning a material layer on a substrate. The method includes forming a hard mask layer on a material layer disposed on a substrate. The material layer includes a plurality of first layers and a plurality of second layers alternately formed over the substrate. The method further includes performing a first etch process to form features in the material layer through the hard mask layer by supplying a first etching gas; performing an oxidation process to oxidize a sidewall of the features by supplying an oxidation gas; and performing a second etch process to etch the sidewall of the features formed in the material layer by suppling a second etching gas.

Embodiments of the present disclosure also provide a method for etching a material layer on a substrate through a hard mask in a processing chamber. The method includes supplying a first etching gas to a material layer having a hard mask formed thereon in a processing chamber to form features in the material layer. The material layer includes a plurality of first layers and a plurality of second layers alternately formed over a substrate. The method further includes, subsequent to supplying the first etching gas, supplying an oxidizing gas to oxidize a sidewall of the features; and, subsequent to supplying the oxidizing gas, exposing the features to a second etching gas.

Embodiments of the present disclosure also provide a method for reducing the sidewall thickness variation of features etched in a material layer. The method includes flowing an oxidation gas to a material layer in a processing chamber, the material layer comprising a plurality of first layers and a plurality of second layers alternately formed over a substrate; and forming an oxide layer on a sidewall of the features, wherein the oxide layer has a first side and a second side, the first side of the oxide layer being disposed on and conformal to a contour of the feature, and the second side of the oxide layer having a second side variation of about 1 nm to about 2 nm, the second side variation being a difference between a maximum point of the second side and a minimum point of a second side.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

FIG. 1 is a flowchart of a method for patterning a material layer on a substrate, according to one or more embodiments of the disclosure.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for patterning features with reduced sidewall thickness variation in multi-material layers are provided.

The methods utilize a first etch process to form features in the material layer through a hard mask layer by supplying a first etching gas, performing an oxidation process to oxidize a sidewall of the features by supplying an oxidation gas, and performing a second etch process to etch the sidewall of the features formed in the material layer by suppling a second etching gas. By doing so, features having reduced the sidewall thickness variation can be formed at a high overall etch rate.

A processing chamber that may be adapted to benefit from the disclosure is a CENTRIS® Sym3™ processing chamber, available from Applied Materials, Inc., located in Santa Clara, California. It is contemplated that other process chambers, including those from other manufactures, may be adapted to practice embodiments of the disclosure.

FIG. 1 is a flow diagram of a method 100 for patterning a material layer disposed on a substrate. FIGS. 2A-2D are cross-sectional views of a structure 200 formed on a substrate 202 corresponding to various stages of the method 100. The method 100 may be utilized to etch high aspect ratio features, e.g., greater than 10:1 ratios, in a material layer.

The substrate 202 may be a silicon based material, suitable insulating material, or conductive material depending upon the desired implementation. The substrate 202 may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire. The substrate 202 may have various diameters, such as 200 mm, 300 mm, 450 mm, or other diameters, as well as rectangular or square substrates. Unless otherwise noted, implementations and examples described herein are conducted on substrates with a 200 mm diameter, a 300 mm diameter, or a 450 mm diameter substrate. In the implementations where a SOI structure is utilized for the substrate 202, the substrate 202 may include a buried dielectric layer disposed on a silicon crystalline substrate. In the example depicted herein, the substrate 202 is a crystalline silicon substrate.

Figure 2A:
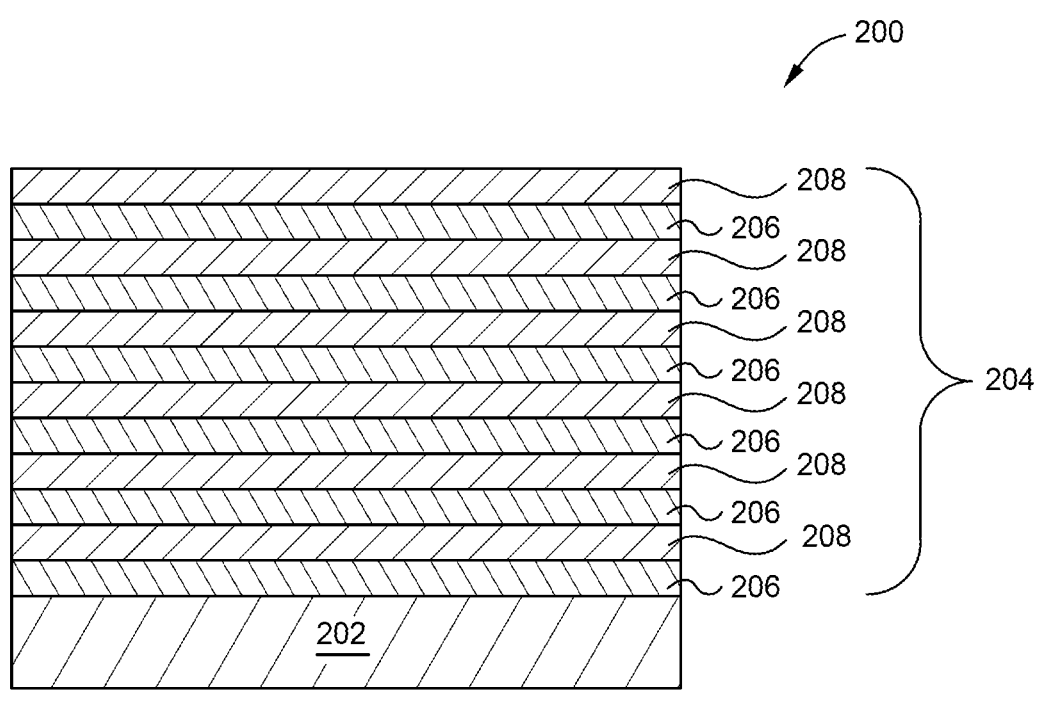
FIG. 2A is a schematic cross sectional view of a structure prior to a main etching process, according to one or more embodiments of the present disclosure.

As shown in FIG. 2A, the structure 200 may include a multi-material layer 204 formed of conductive material and utilized to be part of an integrated circuit, such as gate electrodes, interconnect lines, and contact plugs. In some embodiments, the multi-material layer 204 includes a number of stacked layers formed on the substrate 202. The multi-material layer 204 may include first layers 206 and second layers 208 alternately formed over the substrate 202. Although FIG. 2A shows six repeating layers of first layers 206 and second layers 208 alternately formed on the substrate 202, any desired number of repeating pairs of first layers 206 and second layers 208 may be utilized.

In some examples, the multi-material layer 204 may be formed of refractory metals, such as tungsten (W), molybdenum (Mo), tantalum (Ta), titanium (Ti), hafnium (Hf), vanadium (V), chromium (Cr), manganese (Mn), ruthenium (Ru), alloys thereof, silicide compounds thereof, nitride compounds thereof, or combinations thereof. In other examples, the first layers 206 and the second layers 208 may be other metals, such as copper (Cu), nickel (Ni), cobalt (Co), iron (Fe), aluminum (Al), palladium (Pd), gold (Au), silver (Au), platinum (Pt), alloys thereof, nitride compounds thereof, or combinations thereof. In one embodiment, the first layers 206 are formed of silicon-germanium (SiGe) and the second layers 208 are formed of silicon (Si). The multi-material layer 204 may have a total thickness from about 0.2 μm to about 25 μm. The first layers 206 may each have a thickness from about 10 nm to about 100 nm. The second layers 208 may each have a thickness from about 10 nm to about 100 nm.

Figure 2B:
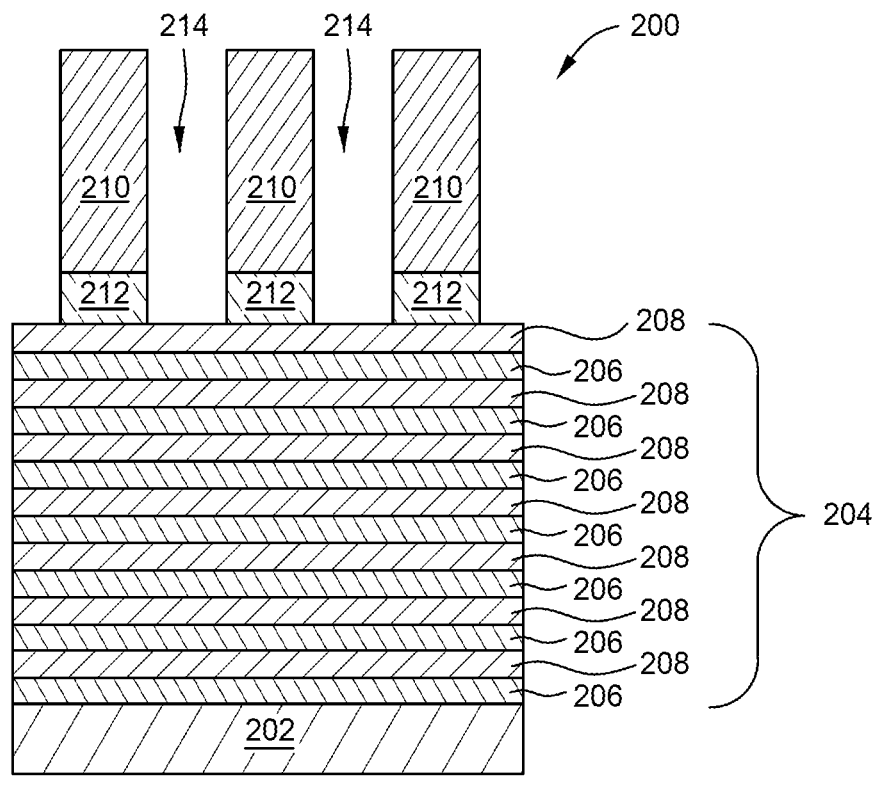
FIG. 2B is a schematic cross sectional view of a structure prior to a main etching process with a hard mask layer and adhesion layer disposed thereon, according to one or more embodiments of the disclosure.

At operation 101, prior to an etching process, an etch resist hard mask layer 210 is formed on the multi-material layer 204 disposed over the substrate in a processing chamber. As shown in FIG. 2B, the structure 200 includes the hard mask layer 210 formed in a desired pattern on the multi-material layer 204. The pattern on the hard mask layer 210 may have openings 214 having a dimension from about 1.0 μm and about 1.3 μm, to form features having a high aspect ratio (e.g., greater than about 5:1), and a pitch between adjacent openings 214 of between about 50 nm and about 180 nm. The structure 200 may include an adhesion layer 212 formed between the multi-material layer 204 and the hard mask layer 210. The adhesion layer 212 may function as a barrier layer between the multi-material layer 204 and the hard mask layer 210. The adhesion layer 212 may also function as a polish stop for a subsequent chemical mechanical polishing (CMP) operation.

The hard mask layer 210 may be formed of tetra-ethylorthosilicate (TEOS) or silicon oxynitride (SiON) and have a thickness of about 0.5 μm and about 2 μm. The adhesion layer 212 may be formed of any dielectric material, such as silicon nitride (Si$_3$N$_4$) and have a thickness of less than about 100 nm. The hard mask layer 210 and the adhesion layer 212 may be deposited by any suitable deposition process, such as a chemical vapor deposition (CVD) process, a physical vapor deposition (PVD) process, an atomic layer deposition (ALD) process, or a spin-on process. The hard mask layer 210 and or adhesion layer 212 are subsequently patterned by a photolithographic process using a patterned photoresist layer (not shown) covering the hard mask layer 210.

In some embodiments, additional layers may be disposed above the hard mask layer 210, such as an advanced patterning film (APF), a dielectric anti-reflective coating (DARC), a bottom anti-reflective coating (BARC), a top anti-reflective coating (TARC), a photoresist (PR) layer, a carbon layer, or other suitable layer. The APF may include a carbon film, amorphous carbon film, or other suitable APF. The APF layer has a thickness of about 250 nm to about 750 nm, such as about 500 nm. The DARC has a thickness of about 25 nm to about 100 nm, such as about 80 nm. The BARC has a thickness of about 10 nm to about 50 nm, such as about 25 nm. The TARC has a thickness of about 10 nm to about 50 nm, such as about 25 nm. The PR layer may include a light sensitive material such as a polymer, a sensitizer, or a baked solvent. The PR layer has a thickness of about 50 nm to about 500 nm, such as about 150 nm.

Figure 2C:
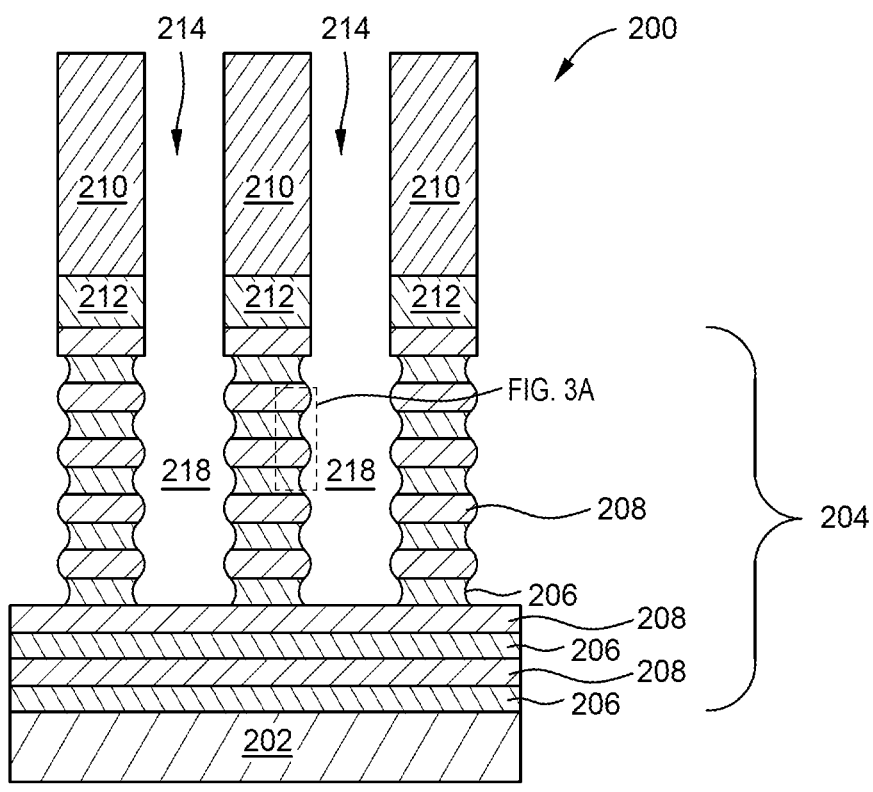
FIG. 2C is a schematic cross-section of the features formed in the multi-material layers prior to an oxidation process, according to one or more embodiments of the disclosure.

At operation 102, as shown in FIG. 2C, a first etching process (also referred to as a "main etch" process) is performed to form features 218 (e.g., trenches or vias) in the multi-material layer 204 through the hard mask layer 210. The features 218 may be formed using plasma excited species or radicals in a plasma process chamber. In the main etch process at operation 104, the multi-material layer 204 is etched using an etching gas to a predetermined depth. In some embodiments, a process gas may be flowed with the etching gas. In one embodiment, an HBr process gas/Cl$_2$ etching gas mixture may be used, as chlorine containing etching gas provides a fast etch rate for the multi-material layer 204. In some embodiments, the fast etch rate is between about 100 nm/minute to about 200 nm/minute. In other embodiments, the fast etch rate is greater than about 200 nm/minute. The main etch process may be continued until a depth of the features 218 in the multi-material layer 204 reaches a predetermined depth. In some embodiments, the determined depth of the features 218 in the multi-material layer 204 is from about 0.2 μm to about 4.5 μm. In other embodiments, the depth of the main etch process may be the depth of one first layer 206 and one second layer 208, e.g., from about 20 nm to about 60 nm, and repeated until the depth of the features 218 reaches the predetermined depth.

In the main etch process at operation 102, due to a difference between an etch rate of the first layers 206 and an etch rate of the second layer 208, the etched features 218 (e.g. trenches or vias) in the multi-material layer 204 may have a contour consisting of rough sidewalls having protrusions and recessions in scallop-like shapes (referred to as "scallops") or other rough features. In the example shown in FIG. 2C, the first layers 206 have a slower etch rate than the second layers 208 during the main etch process at operation 104 using the etching gas mixture.

Figure 3A:
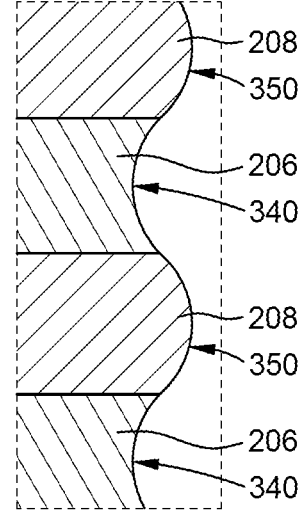
FIG. 3A is a schematic cross-section of a portion of the structure before oxidation, according to one or more embodiments of the present disclosure.

FIG. 3A is a schematic cross-section of a portion of the structure 200 before an oxidation process. As a result of the variations in the etch rate, as shown in FIG. 3A, the first layers 206 include recessions 340 that are recessed as compared to the second layer 208, and the second layers 208 include protrusions 350 that are protruding as compared to the first layer 206. The combination of recessions 340 and protrusion 350 are collectively referred to as "scalloping". In some embodiments, the protrusions 350 and recessions 340 may not align directly with the first layer 206 and the second layer 208, respectively. For example, the recessions 340 may occur on a portion of the first layer 206 and a portion of the second layer 208 or the protrusions 350 may occur on a portion of the first layer 206 and a portion of the second layer 208. The protrusions 350 and recessions 340 have increased surface area compared to the desired flat surface of the trench or via.

Suitable examples of process gases include, but are not limited to, hydrocarbon containing gases such as methane ($CH_4$), sulfur hexafluoride ($SF_6$), silicon chloride ($SiCl_4$), carbon tetrafluoride ($CF_4$), hydrogen bromide (HBr), argon gas (Ar), chlorine ($Cl_2$), nitrogen ($N_2$), helium (He) and oxygen gas ($O_2$). Additionally, process gases may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, CO, $N_2$, $NO_2$, $N_2O$, and $H_2$, among others. Suitable examples of the etching gas include $SF_6$ or a chlorine containing gas such as $Cl_2$, $SiCl_4$, $BCl_3$, $SiHCl_3$, $SiH_2Cl_2$, $SiH_3Cl$, $Si_2Cl_6$, or combinations thereof. In one embodiment, the chlorine containing etching gas includes $SiCl_4$, $Cl_2$, and $BCl_3$.

During the main etch process at operation 104, several process parameters may also be regulated. In one embodiment, etching gases, such as chlorine, is supplied at flow rates from about 10 sccm to about 1000 sccm, such as from about 30 sccm to about 800 sccm, such as about from about 100 sccm to about 500 sccm. Process gases, such as HBr, may be supplied at a flow rate from about 50 sccm to about 1000 sccm, for example, about 300 sccm. In one embodiment, the ratio of processing gas to etching gas (P:E ratio), such as HBr:$Cl_2$, may be from about 1:10 to about 10:1, such as about 3:2 (e.g., about 300 sccm HBr to about 200 sccm $Cl_2$). By increasing the processing gas in the P:E ratio, the scalloping can be pushed deeper into the trench or via. Too little processing gas may show less bowing in the scalloping, but may also lead to higher lateral loss due to high amounts of etching gas. Too much processing gas reduces the etching rate due to lack of etching gas, and shows more bowing.

In one embodiment, a process pressure in the plasma processing chamber is regulated from about 3 mTorr to about 100 mTorr, such as about 10 mTorr to about 50 mTorr, such as about 15 mTorr. Lowering the chamber pressure may achieve more directional etching and minimize lateral etching, creating less bowing.

In one embodiment, a second etching gas may be flowed into the chamber with the process gas and etching gas. The second etching gases may include a silicon containing etching gas. Suitable examples of the silicon containing etching gas include $SiCl_4$, $SiHCl_3$, $SiH_2Cl_2$, $SiH_3Cl$, and $Si_2Cl_6$. The silicon containing etching gas may contribute to silicon oxide passivation on the sidewall, thus reducing the scalloping. The silicon containing etching gas may be flowed into the chamber at a rate of about 0 sccm to about 100 sccm, such as about 5 sccm to about 50 sccm, such as about 20 sccm. Higher amounts of silicon containing etching gas, however, may contribute to a slower etching rate.

An RF source and/or bias power may be utilized while performing the main etch process at operation 104. The RF bias power applied when supplying the etching gas assists in forming the reactive etchants with desired directionality so as to travel down to surfaces of the multi-material layer 204 that is exposed from the hard mask layer 210 to predominately etch the multi-material layer 204. In contrast, the elimination of the RF bias power can assist the reactive species in the plasma to be more uniformly distributed across the hard mask layer 210. For example, an RF source power of from about 500 Watts to about 2000 Watts may be applied to maintain a plasma inside the processing chamber. An RF bias power from about 500 Watts to about 6000 Watts may be applied, such as about 1500 Watts.

A substrate support pedestal to support the substrate 202 is maintained at a temperature from about 50° C. to about 290° C., for example, about 110° C. during the main etch process at operation 104.

Figure 3B:
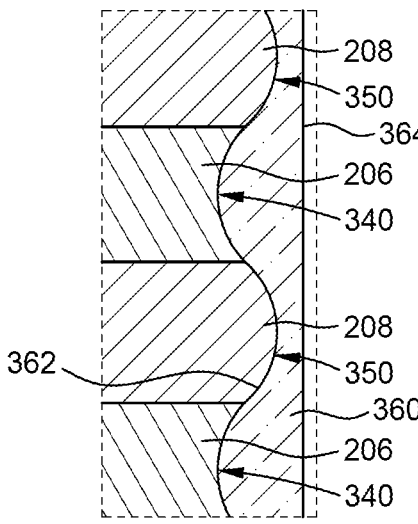
FIG. 3B is a schematic cross-section of a portion of the structure after oxidation, according to one or more embodiments of the present disclosure.

At operation 103, an oxidation process is performed to reduce a sidewall thickness variation of the features 218 etched in the main etch process at operation 104. The oxidation process includes flowing an oxidation gas into the chamber to form an oxide layer 360, as shown in FIG. 3B. In one embodiment, between about 50 sccm and about 250 sccm, such as about 180 sccm, of oxidation gas is delivered into the chamber. The oxidation gas may include $O_2$, $H_2O$, $O_3$ (ozone), or a combination thereof. In some embodiments, the chamber pressure during the oxidation process is from about 10 mTorr to about 50 mTorr, such as about 20 mTorr. An RF bias power may be applied to maintain a plasma inside the processing chamber. The RF bias power may be applied from about 500 to about 600 Watts, such as about 2500 Watts. In an embodiment using 02, a dry oxidation process is performed. In an embodiment using $H_2O$, a wet oxidation process is performed. In one embodiment, the first layers 206 are formed of silicon-germanium (SiGe) and the second layers 208 are formed of silicon (Si). The oxidation process forms a silicon oxide material (e.g. $SiO_2$) on the surface of the first layer 206 and second layer 208.

FIG. 3B is a schematic cross-section of a portion of the structure 200 after the oxidation process. The increased surface area of the recessions 340 and protrusions 350 of the scalloping facilitate growth of the oxide layer 360. The oxide layer 360 further includes a first side 362 and a second side 364. The first side 362 of the oxide layer 360 is disposed over the sidewall of the features 218. In some embodiments, the oxide layer 360 is disposed on and conformal to the contours of the sidewall of the features 218. The second side 364 of the oxide layer 360 is substantially linear, e.g., the second side 364 has a second side variation between about 0 nm to about 5 nm, such as about 1 nm to about 2 nm. The second side variation is defined at the difference between a maximum thickness and a minimum thickness of the oxide layer 360, wherein the thickness is measured between the first side 362 of the oxide layer 360 and the second side 364 of the oxide layer 360. The growth of the oxide layer 360 on the sidewall of the features 218 results in a reduced sidewall variation within the trench or via. The sidewall variation is defined as the difference between a maximum point on a protrusion 350 and the minimum point on a recession 340. The sidewall variation due to the oxidation process is between about 0 nm to about 5 nm, such as about 1 nm to about 2 nm.

Figure 2D:
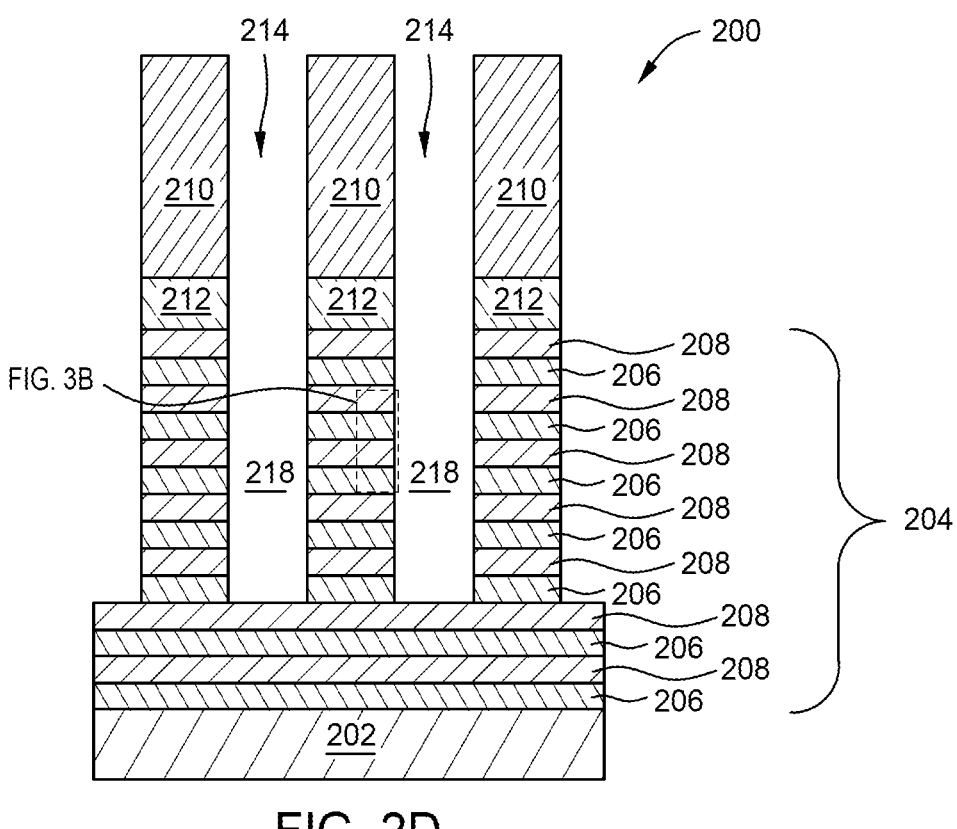
FIG. 2D is a schematic cross-section of the features formed in the multi-material layers 204 after the post etch process at operation, according to one or more embodiments of the disclosure.

At operation 104, a second etching process (also referred to as a "post etch" process) is performed to further reduce the sidewall thickness variation of the features 218 etched in the main etch process at operation 104. FIG. 2D is a schematic cross-section of the features 218 formed in the multi-material layers 204 after the post etch process at operation 104. Using fluorine containing etching gas, the remaining sidewall variation from the oxidation process can be removed by removing the byproducts of the oxidation process. As a result, the protrusions 350 and recessions 340 formed on the sidewalls of the features 218 are removed or reduced to scallops having a magnitude of less than about 1.5 nm. Suitable examples of the fluorine containing etching gas include $SF_6$, $CH_2F_4$, $C_4F_8$, $CF_4$, $CHF_3$, $C_2F_6$, $C_3F_8$, $NF_3$, HF, or combinations thereof.

In some embodiments, the post etch process is performed by simultaneously supplying the fluorine containing etching gas, passivation gas, and inert gas such as argon (Ar) in the plasma processing chamber.

The passivation gas selectively passivates the sidewalls of the features 218 to reduce bowing profiles of the sidewalls of the features 218. Suitable examples of the passivation gas include HBr, $BCl_3$, $SF_6$, or $H_2S$. In one embodiment, the fluorine containing etching gas includes $SF_6$, and the passivation gas includes HBr.

The inert gas, such as argon (Ar), is delivered at a high flow rate to generate low pressure at or near the bottom of the features 218 in the multi-material layer 204 such that the second etching gas reaches the bottom of the features 218 in the multi-material layer 204. Thus, the sidewall thickness variation of the features 218 can be reduced.

During the post etch process at operation 104, several process parameters may also be regulated. In one example, $SF_6$ and HBr gases may be supplied at flow rates from about 25 sccm to about 150 sccm, for example, about 50 sccm, and from about 10 sccm to about 1000 sccm, for example, about 50 sccm, respectively. Inert gas such as argon (Ar) may be supplied at a flow rate from 100 sccm to about 1000 sccm, for example, about 900 sccm. The fluorine containing etching gas is supplied pulsed at a pulse duration from about 1 seconds to about 10 seconds, for example, about 5 seconds. A duty cycle (i.e., a ratio of an "on" period in which the fluorine containing etching gas is supplied to an "off" period in which the fluorine containing etching gas is not supplied) may be from about 1:3 to about 3:1, for example, about 1:1. The post-etch process at operation 104 may be repeated from about 6 seconds to about 1800 seconds, for example, about 40 seconds, corresponding to about 4 pulse cycles depending on the total thickness of the multi-material layer 304. In one embodiment, a process pressure in the plasma processing chamber is regulated from about 10 mTorr to about 5000 mTorr, such as from about 20 mTorr to about 500 mTorr.

An RF source and/or bias power may be utilized while performing the etching process. For example, an RF source power of less than about 2000 Watts may be applied to maintain a plasma inside the processing chamber. An RF bias power of less than about 6000 Watts may be applied when the fluorine containing etching gas is supplied, and an RF bias power from about 1000 Watts to about 6000 Watts may be applied.

The plasma processing chamber is maintained at a temperature from about 75° C. to about 150° C., for example about 110° C. during the post etch process at operation 104.

In some embodiments, a flow rate of the $SF_6$, the number of $SF_6$ pulse periods, and the temperature in the plasma processing chamber are adjusted to modulate thickness variation of the sidewalls (e.g., a magnitude of the scallops) of the features 118.

In some embodiments, the trench or via is formed by main etching the multi-material layer 204, oxidation processing the multi-material layer 204, and post-etching the multi-material layer 204. In other embodiments, the trench or via is formed by main etching a single first layer 206 and a single second layer 208, oxidation processing the first layer 206 and the second layer 208, post-etching the first layer 206 and the second layer 208, and repeating the main etching, oxidation processing, and post-etching or each subsequent first layers 206 and second layers 208. In other embodiments, the trench or via is formed by main etching one or more first layers 206 and one or more second layers 208, oxidation processing the one or more first layers 206 and the one or more second layers 208, post-etching the one or more first layers 206 and the one or more second layers 208, and repeating the main etching, oxidation processing, and post-etching or each subsequent one or more first layers 206 and one or more second layers 208.

Benefits of the present disclosure include improvement in patterning features with accurate and uniform profiles for three dimensional (3D) semiconductor device structures. The methods according to the embodiments disclosed herein utilize a three-operation etching process, which includes a main etch process to form features through a multi-material layer by continuously supplying etching gas, an oxidation process to oxidize and decreases a thickness variation of a sidewall of the features, and a post etch process to reduce the sidewall thickness variation of the features through the multi-material layer by pulsing etching gas. The main etch process provides a fast etch rate through the multi-material layer while the oxidation process and post etch process is adjusted to reduce the sidewall thickness variation of the features to a desired sidewall thickness variation. By doing so, features having reduced the sidewall thickness variation can be formed at a high overall etch rate.

While the foregoing is directed to embodiments of the present disclosure, other and further embodiments of the disclosure may be devised without departing from the basic scope thereof, and the scope thereof is determined by the claims that follow.

We claim:

1. A method for patterning a material layer on a substrate, comprising:

forming a hard mask layer on a material layer disposed on a substrate, the material layer comprising a plurality of first layers and a plurality of second layers alternately formed over the substrate;

performing a first etch process to form features in the material layer through the hard mask layer by supplying a first etching gas, wherein the first etch process etches the plurality of first layers at a first etch rate and the plurality of second layers at a second etch rate to form a plurality of protrusions and a plurality of recessions on a sidewall of the features;

performing an oxidation process to oxidize a sidewall of the features by supplying an oxidation gas and forming an oxide layer, wherein a first side the oxide layer adjacent the plurality of protrusions and the plurality of recessions is conformal to the plurality of protrusions and the plurality of recessions; and performing a second etch process on the oxide layer to etch a second side of the oxide layer by suppling a second etching gas, the second side being planar and opposite the first side, wherein a difference between a maximum thickness and a minimum thickness of the oxide layer is about 1 nm to about 2 nm after performing the second etch process.

2. The method of claim 1, wherein the plurality of first layers and the plurality of second layers comprise tungsten (W), molybdenum (Mo), tantalum (Ta), titanium (Ti), hafnium (Hf), vanadium (V), chromium (Cr), manganese (Mn), ruthenium (Ru), alloys thereof, silicide compounds thereof, nitride compounds thereof, copper (Cu), nickel (Ni), cobalt (Co), iron (Fe), aluminum (Al), palladium (Pd), gold (Au), silver (Au), platinum (Pt), alloys thereof, nitride compounds thereof, silicon-germanium (SiGe), silicon (Si), or combinations thereof.

3. The method of claim 1, wherein:
the material layer has a thickness of between 0.2 µm and 25 µm; and
each layer of the plurality of first layers and the plurality of second layers each has a thickness of between 10 nm and 30 nm.

4. The method of claim 1, wherein the second etch process further comprises supplying an inert gas to generate a pressure at a bottom of the features such that the second etching gas reaches the bottom of the features.

5. The method of claim 1, wherein:
the first etching gas comprises $Cl_2$, $SiCl_4$, $BCl_3$, $SiHCl_3$, $SiH_2Cl_2$, $SiH_3Cl$, $Si_2Cl_6$, or combinations thereof; and
the second etching gas comprises $SF_6$, $CH_2F_4$, $C_4F_8$, $CF_4$, $CHF_3$, $C_2F_6$, $C_3F_8$, $NF_3$, HF, or combinations thereof.

6. The method of claim 1, wherein the oxidation gas comprises $O_2$, $H_2O$, $O_3$, or combinations thereof.

7. The method of claim 1, wherein during the oxidation process, the oxidation gas is flowed at a rate of about 50 sccm to about 250 sccm.

8. The method of claim 1, wherein a chamber pressure during the oxidation process is from about 10 mTorr to about 50 mTorr, and an RF power bias is applied from about 500 Watts to about 600 Watts.

9. A method for etching a material layer on a substrate through a hard mask in a processing chamber, comprising:
supplying a first etching gas to a material layer having a hard mask formed thereon in a processing chamber to form features in the material layer, the material layer comprising a plurality of first layers and a plurality of second layers alternately formed over a substrate, wherein the first etching gas etches the plurality of first layers at a first etch rate and the plurality of second layers at a second etch rate to form a plurality of protrusions and a plurality of recessions on a sidewall of the features;
subsequent to supplying the first etching gas, supplying an oxidizing gas to oxidize a sidewall of the features and form an oxide layer, wherein a first side the oxide layer adjacent the plurality of protrusions and the plurality of recessions is conformal to the plurality of protrusions and the plurality of recessions;
subsequent to supplying the oxidizing gas, exposing the features to a second etching gas; and
etching a second side of the oxide layer with the second etching gas, the second side being planar and opposite the first side, wherein a difference between a maximum thickness and a minimum thickness of the oxide layer is about 1 nm to about 2 nm.

10. The method of claim 9, wherein the plurality of first layers and the plurality of second layers comprise tungsten (W), molybdenum (Mo), tantalum (Ta), titanium (Ti), hafnium (Hf), vanadium (V), chromium (Cr), manganese (Mn), ruthenium (Ru), alloys thereof, silicide compounds thereof, nitride compounds thereof, copper (Cu), nickel (Ni), cobalt (Co), iron (Fe), aluminum (Al), palladium (Pd), gold (Au), silver (Au), platinum (Pt), alloys thereof, nitride compounds thereof, silicon-germanium (SiGe), silicon (Si), or combinations thereof.

11. The method of claim 9, wherein:
the material layer has a thickness of between 0.2 µm and 25 µm; and
each layer of the plurality of first layers and the plurality of second layers has a thickness of between 10 nm and 30 nm.

12. The method of claim 9, further comprising supplying an inert gas subsequent to supplying the second etching gas.

13. The method of claim 9, wherein:
the first etching gas comprises $Cl_2$, $SiCl_4$, $BCl_3$, $SiHCl_3$, $SiH_2Cl_2$, $SiH_3Cl$, $Si_2Cl_6$, or combinations thereof; and
the second etching gas comprises $SF_6$, $CH_2F_4$, $C_4F_8$, $CF_4$, $CHF_3$, $C_2F_6$, $C_3F_8$, $NF_3$, HF, or combinations thereof.

14. The method of claim 9, wherein the oxidation gas comprises $O_2$, $H_2O$, $O_3$, or combinations thereof.

15. The method of claim 9, wherein the oxidizing gas is supplied at a rate of about 50 sccm to about 250 sccm.

16. A method for reducing a sidewall thickness variation of a feature etched in a material layer, comprising:
flowing an oxidation gas to a material layer in a processing chamber, the material layer comprising a plurality of first layers and a plurality of second layers alternately formed over a substrate to form a feature, wherein the plurality of first layers and the plurality of second layers form a plurality of protrusions and a plurality of recessions on a sidewall of the feature; and
forming an oxide layer on a sidewall of the features, wherein the oxide layer has a first side and a second side, the first side of the oxide layer being disposed on and conformal to the plurality of protrusions and the plurality of recessions on the sidewall of the feature, and the second side being planar and opposite the first side, wherein the oxide layer has a second side variation of about 1 nm to about 2 nm, the second side variation being a difference between a maximum thickness and a minimum thickness of the oxide layer.

17. The method of claim 16, wherein the plurality of first layers and the plurality of second layers comprise tungsten (W), molybdenum (Mo), tantalum (Ta), titanium (Ti), hafnium (Hf), vanadium (V), chromium (Cr), manganese (Mn), ruthenium (Ru), alloys thereof, silicide compounds thereof, nitride compounds thereof, copper (Cu), nickel (Ni), cobalt (Co), iron (Fe), aluminum (Al), palladium (Pd), gold (Au), silver (Au), platinum (Pt), alloys thereof, nitride compound thereof, silicon-germanium (SiGe), silicon (Si), or combinations thereof.

18. The method of claim 16, wherein the oxidation gas comprises $O_2$, $H_2O$, $O_3$, or combinations thereof.

19. The method of claim 16, wherein the oxidizing gas is flowed at a rate of about 50 sccm to about 250 sccm.

20. The method of claim 16, wherein:

the material layer has a thickness of between 0.2 μm and 25 μm; and each layer of the plurality of first layers and the plurality of second layers has a thickness of between 10 nm and 30 nm.

\* \* \* \* \*